United States Patent [19]

Atalar et al.

[11] Patent Number: 5,512,825
[45] Date of Patent: Apr. 30, 1996

[54] METHOD OF MINIMIZING DEAD-PERIODS IN MAGNETIC RESONANCE IMAGING PULSE SEQUENCES AND ASSOCIATED APPARATUS

[75] Inventors: Ergin Atalar, Baltimore; Elliot R. McVeigh, Timonium, both of Md.

[73] Assignee: The Johns Hopkins University, Baltimore, Md.

[21] Appl. No.: 346,130

[22] Filed: Nov. 25, 1994

[51] Int. Cl.⁶ .............................. G01V 3/00; G01V 3/14
[52] U.S. Cl. ..................... 324/309; 324/303; 324/307
[58] Field of Search .................... 324/303, 307, 324/309, 318, 322

[56] References Cited

U.S. PATENT DOCUMENTS

| | | | |
|---|---|---|---|
| 4,766,381 | 8/1988 | Conturo et al. | 324/309 |
| 5,099,208 | 3/1992 | Fitzpatrick et al. | 324/312 |
| 5,352,959 | 10/1994 | Conturo | 324/307 |

OTHER PUBLICATIONS

Bernstein, "Pulse Sequence Generated Oblique Magnetic Resonance Imaging: Applications to Cardiac Imaging" Med. Phys., vol. 13, pp. 648–657 (1986); Erratum; Med. Phys. 14 (1):145 (1987).

Bernstein et al., "Angle–Dependent Utilization of Gradient Hardware for Oblique MRI," J. Mag. Reson. Imag., vol. 4, pp. 105–108 (Jan. 1994).

*Primary Examiner*—Sandra L. O'Shea
*Assistant Examiner*—Mack Haynes

*Attorney, Agent, or Firm*—Eckert Seamans Cherin & Mellott; Arnold B. Silverman

[57] ABSTRACT

A method of minimizing dead-periods in magnetic resonance imaging pulse sequences employs a specimen disposed within magnetic field, a source of RF signals, a receiver for receiving signals from the specimen responsive to RF pulses and emitting respective output signals. A computer is provided for receiving the output signals from the receiver and establishing image information which may be displayed. For the dead-period, the minimum and maximum phase encoding step, the scan plane gradient pulse for the slice, phase encoding and readout directions are determined and the moments contained within the dead-period waveform is determined. The values are transformed into gradient amplifier coordinates and the minimum dead-period based on a dead-period waveform is determined. The dead-period is employed in establishing a hardware optimized waveform which may be trapezoidal. The trapezoidal waveform is preferably established by for each phase encoding step determining the starting and ending gradient levels and the moments contained within the dead-period waveform and employing the waveform to design a trapezoidal waveform using the calculated minimum dead-period. The method is particularly advantageous when employed in oblique magnetic resonance imaging. The method may also be employed with velocity-encoded or flow-compensated pulse sequences by employing first gradient moments in the information processing, in addition to the starting and ending gradient levels and the zeroeth moments. For other types of pulse sequences, the zeroeth moment and other higher moments may be employed. Associated apparatus is also disclosed.

40 Claims, 11 Drawing Sheets

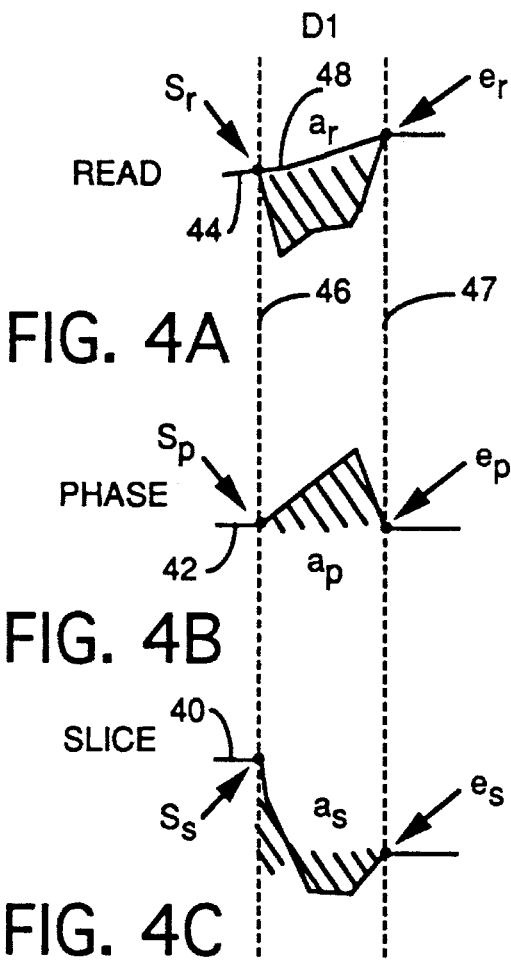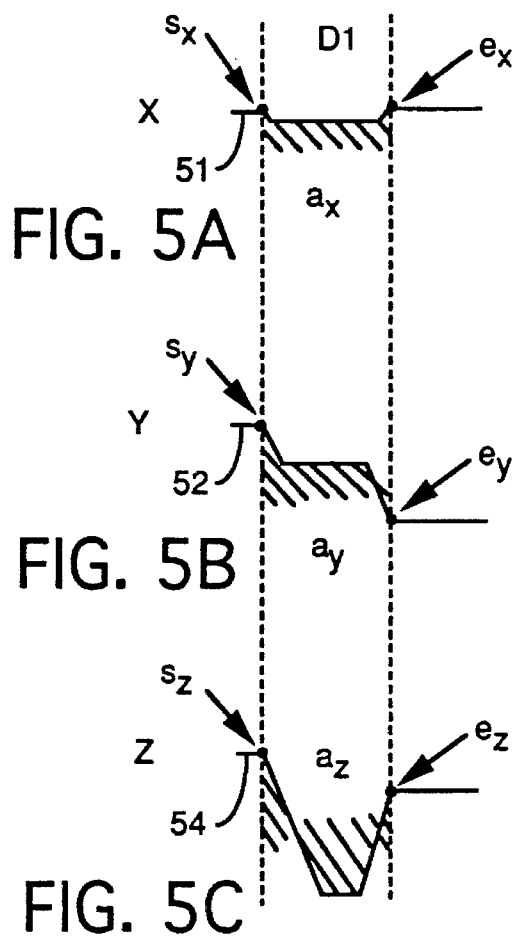

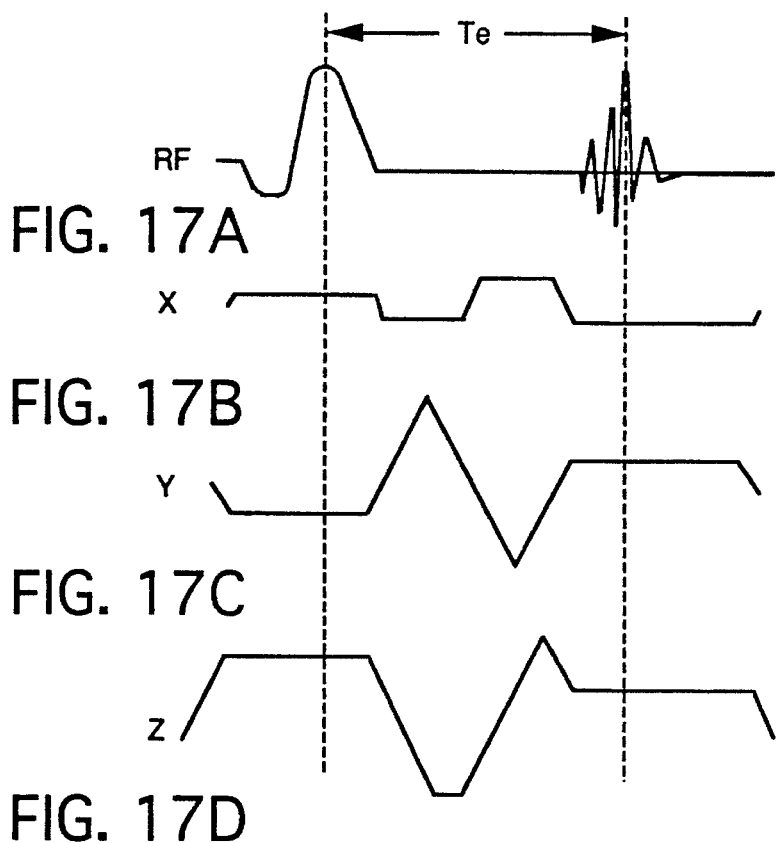
FIG. 17A
FIG. 17B
FIG. 17C
FIG. 17D
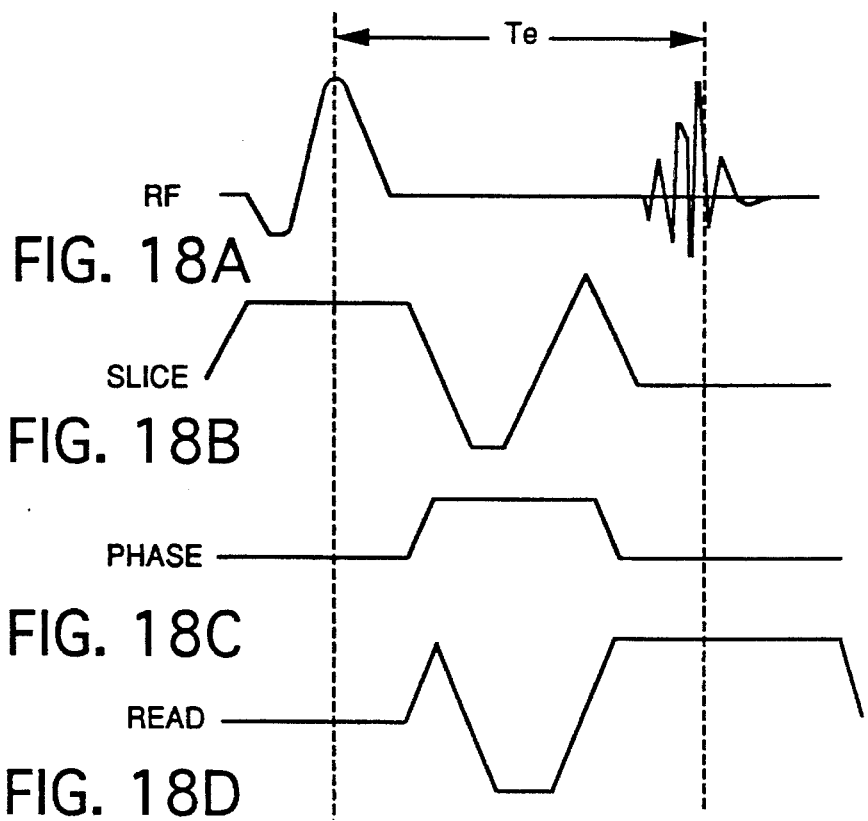
FIG. 18A
FIG. 18B
FIG. 18C
FIG. 18D

METHOD OF MINIMIZING DEAD-PERIODS IN MAGNETIC RESONANCE IMAGING PULSE SEQUENCES AND ASSOCIATED APPARATUS

BACKGROUND OF THE INVENTION

1. Field of the Invention

The present invention relates to an improved method for reducing the dead-periods in magnetic resonance imaging pulse sequences and to associated apparatus and, more specifically, it relates to a simplified means for reducing dead-periods by employing a calculated waveform and, most specifically, is particularly advantageous in imaging oblique planes.

2. Description of the Prior Art

The advantageous use of non-invasive and non-destructive test procedures has long been known in both medicine and industrial applications. In respect of medical uses that limit a patient's exposure to potentially damaging x-ray radiation, it has been known to accomplish this objective through the use of other non-invasive imaging procedures, such as, for example, ultrasound imaging and magnetic resonance imaging. See, for example, U. S. Pat. Nos. 4,766,381; 5,099,208 and 5,352,959.

In a general sense, magnetic resonance imaging involves providing bursts of radio frequency energy to a specimen positioned in a main magnetic field in order to induce responsive emission of magnetic radiation from the hydrogen nuclei or other nuclei. The emitted signal may be detected in such a manner as to provide information as to the intensity of the response and the spatial origin of the nuclei emitting the responsive magnetic signal. In general, the imaging may be performed in a slice or plane, or multiple planes, or three-dimensional volume with information corresponding to the responsively emitted magnetic radiation being delivered to a computer which stores the information in the form of numbers corresponding to the intensity of the signal. The computer establishes a pixel value as by employing Fourier Transformations which convert the signal amplitude as a function of time to signal amplitude as a function of frequency. The signals may be stored in the computer and may be delivered with or without enhancement to a video screen display, such as a cathode-ray tube, for example, wherein the image created by the computer output will be presented through regions of contrasting black and white which vary in intensity or color presentations which vary in hue and intensity.

The challenges involved in producing high resolution, accurate images in a timely fashion become more complex and difficult to solve when imaging oblique planes. Such oblique plane imaging is frequently employed, for example, in breath-hold magnetic resonance cardiac imaging.

Efforts to employ trapezoidal waveforms which have been employed in non-oblique planes in oblique imaging have resulted in the problems of maximum slew rate and gradient level limitation because the waveforms applied to the gradient amplifiers would not be identical to those applied in non-oblique imaging. The waveforms applied to the amplifiers are a function of the orientation of the slice being imaged. If these non-oblique imaging waveforms were applied in oblique imaging, the gradients would not be able to produce the waveforms and image artifacts and distortions result.

It has been suggested to solve this problem by avoiding application of two or more gradient waveforms simultaneously. See Bernstein et al., "Pulse Sequence Generated Oblique Magnetic Resonance Imaging: Application to Cardiac Imaging," Med. Phys., Vol. 13, pp. 648–657 (1986), Erratum: Med. Phys. 14(1):145, (1987).

It has also been suggested to decrease the slew rates and maximum allowed gradient levels in designing trapezoidal waveforms by a factor of the $\sqrt{3}$. The problem with this approach is that it tends to cause an unnecessary increase in the minimum possible TE and TR. Another approach, which also employs trapezoidal waveforms, calculates the slew rates and maximum gradient levels depending on the orientation of the slice and the number of active gradients. See Bernstein et al., "Angle-Dependent Utilization of Gradient Hardware for Oblique MRI," J. Mag. Reson. Imag., Vol. 4, pp. 105–108 (January 1994). This last method will be referred to herein as the "scan plane optimization" method.

Another approach would be to employ gradient amplifiers and coils that allow higher gradient levels and higher slew-rates. This, of course, would involve the expense of acquiring new hardware.

In spite of the foregoing known systems, there remains, a very real and substantial need for a method of magnetic resonance imaging which is capable of producing faster, high quality magnetic resonance images on an oblique plane in reduced data acquisition time.

SUMMARY OF THE INVENTION

The method of the present invention permits employing conventional magnetic resonance imaging equipment which has the computer controlling operation of the gradient coils and amplifiers programmed, either by appropriate software or hardware embedded means. In order to effect a reduction in TE and TR, in a preferred practice of the method, the duration of each dead-period is reduced. As employed herein, the term "dead-period" in a gradient-echo pulse sequence is the time interval between RF pulses and readout. A dead-period is a time interval in an MR pulse sequences where the waveform shape is not important, but its zeroeth, and/or higher moments are important. The nth moment of a gradient waveform in a dead-period is defined as:

$$m_n = \int_{t_s}^{t_e} g(t) t^n dt \tag{1}$$

where $t_s$ and $t_e$ are the starting and ending time of the waveform g.

As employed herein, the starting and ending values and zeroeth and/or higher moments of the slice, readout and phase encoding waveforms of a dead-period will be referred to as "the parameters of the dead-period." The zeroeth moment will be the dead-period waveform area.

In a preferred practice, for the maximum and minimum phase encoding step, the parameters of the dead-period are determined. These values are transformed into gradient amplifier coordinates and the performance characteristics of the amplifier are used to compute an optimal waveform from the dead-period.

In the preferred practice of the invention, the method involves for each phase encoding step for the slice, phase encoding and readout directions, the starting and ending gradient levels and the moments contained within the waveform are determined and are transformed into gradient amplifier coordinates. The minimum dead-period is then employed with this calculated information to design a hardware optimized waveform for the desired imaging sequence.

This approach is particularly important in respect of oblique scans.

The apparatus of the present invention provides magnetic field generating means for establishing a main magnetic field on the specimen, magnetic field gradient generating means for establishing gradients in said main magnetic field, and RF signal generating means for emitting pulsed RF signals to at least a portion of the magnetic field passing through the specimen. Dead-period determining means to determine the minimum and maximum phase encoding steps by delivering for the slice, phase encoding and readout directions the scan plane pulse starting and ending gradient levels and the zeroeth moment or zeroeth and higher moments contained within the dead-period waveform and transforming these values into gradient amplifier coordinates as by rotation after which the reduced or minimum dead-periods are calculated based upon performance characteristics of the amplifiers. While the preferred practice of the invention employs the minimum dead-period, reductions in the dead-period which do not reach as low as the minimum may be advantageously employed.

The design waveform, which is employable in oblique and non-oblique imaging, is obtained by design waveform creating means which for each phase encoding step for the slice, phase encoding and readout directions calculates the starting and ending gradient levels and the gradient moments contained therein. These values are transformed to gradient amplifier coordinates by rotating the same. A hardware optimized waveform is then determined employing the calculated minimum dead-periods. The apparatus also provides receiver means for receiving signals emitted from the specimen responsive to the RF pulse being emitted and emitting responsive output signals which are delivered to computer means for establishing image information related thereto and visual display means for displaying images from the image information received from the computer means.

It is an object of the present invention to provide a method and related apparatus for providing faster magnetic resonance imaging through reduction in the TE and TR values, without reduction in the signal to noise ratio.

It is a further object of the present invention to provide such a system which may be employed effectively in respect of oblique imaging.

It is another object of the present invention to provide such a system which is adapted for use with existing apparatus and will avoid the undesired need to provide larger capacity amplifiers and coils which would permit higher gradient levels and higher slew rates.

It is a further object of the present invention to facilitate determination of the minimum dead-period times and an effective hardware optimized waveform in gradient amplifier coordinates by focusing on the starting amplitude, the ending amplitude and gradient moments of the dead-period.

It is a further object of the present invention to provide such a system which facilitates determination of the minimum TE and TR for a given set of gradient amplifiers and coils.

It is another object of the present invention to provide improved image quality and more rapid imaging for any magnetic resonance pulse sequence wherein a dead-period exists.

It is a further object of this invention to provide such a system which reduces and, in the preferred form, minimizes TR and TE without altering the slice profile or increasing receiver bandwidth.

It is a further object of the present invention to provide such a system which is employable in breath-hold cardiac imaging.

It is yet another object of the invention to provide such a system wherein the duration of dead-periods may be reduced without altering the receiver bandwidth or the slice profile.

These and other objects of the invention will be more fully understood from the following detailed description of the invention on reference to the illustrations appended hereto.

BRIEF DESCRIPTION OF THE DRAWINGS

FIGS. 4A, 4B, 4C, are of scan gradient values employed in the present invention and FIGS. 5A, 5B, 5C are representation of the waveforms of FIGS. 4A, 4B, 4C after transformation to gradient amplifier coordinates.

FIGS. 17A, 17B, 17C, 17D are plots of an optimized flow-compensated gradient-echo pulse sequence employing hardware optimized trapezoidal pulses in the amplifier coordinate system.

FIGS. 18A, 18B, 18C, 18D are a flow-compensated gradient-echo pulse sequence optimized for a non-oblique plane.

DESCRIPTION OF THE PREFERRED EMBODIMENTS

As used herein, the term "specimen" refers to any object placed in the main magnetic field for imaging and shall expressly include, but not be limited to members of the animal kingdom, including humans, biological tissue samples, and test specimens removed from such members of the animal kingdom. It shall include inanimate objects which may be imaged by magnetic resonance or which contain water or sources of other sensitive nuclei.

Figure 1:
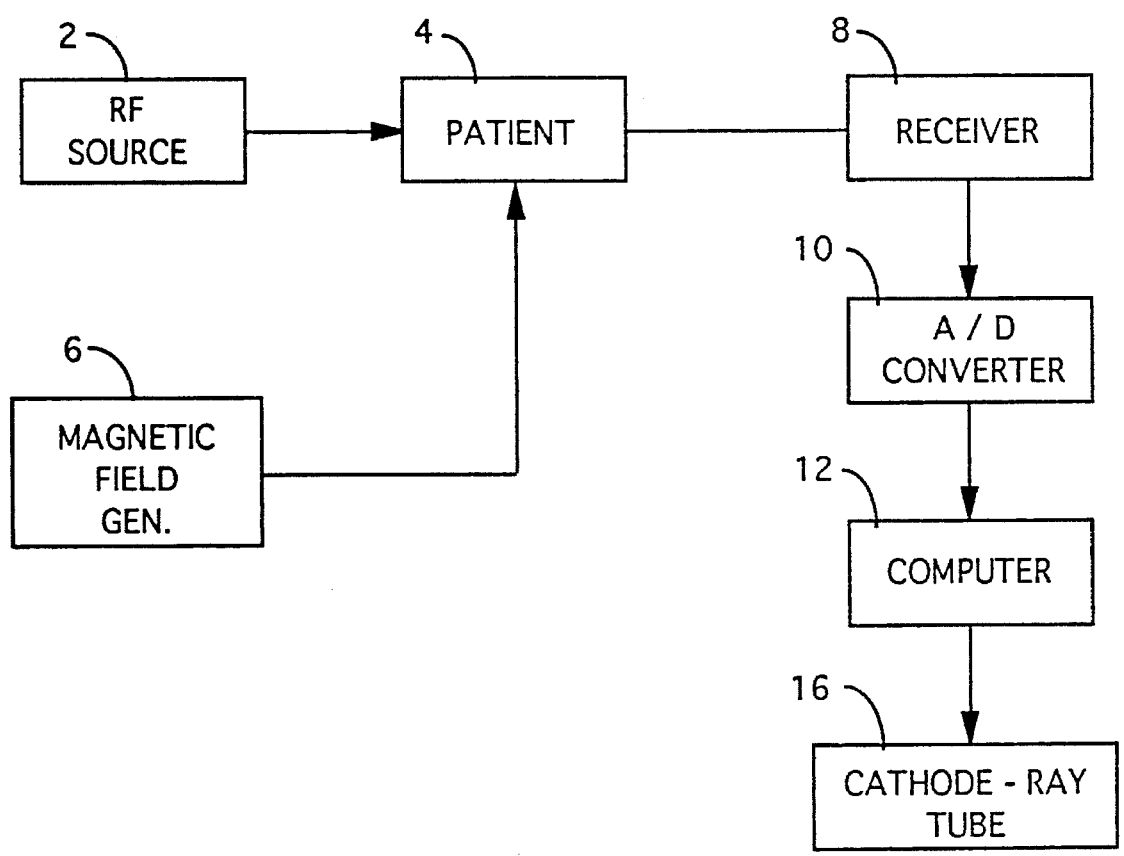
FIG. 1 is a schematic illustration of a magnetic resonance imaging system.

FIG. 1 shows a schematic representation of the general concept of magnetic resonance imaging. An RF source 2 provides a pulse radio frequency energy to the specimen which, in the form shown, is a patient 4 in the main magnetic field which is created by magnetic field generator 6. The specimen is generally aligned with the main magnetic field and the RF pulses are imposed perpendicular thereto. Where oblique imaging is employed, the angle of impingement of the RF vector representing the spatial gradient in the magnetic field will be angularly offset from either the x, y, or z directions. This arrangement results in excitation of the nuclei within the area or volume to be imaged and causes responsive emission of magnetic energy which is picked up by receiver 8.

The receiver 8 may be a coil which has a voltage induced in it as a result of such responsive emissions of magnetic energy. As a practical matter, separate coils or identical coils may be employed as the RF source 2 and the receiver 8. The signal emerging from receiver 8 passes through analog-to-digital (A/D) converter 10 and enters computer 12. Within the computer 12 the Fourier Transformations of signals convert the plot of amplitude versus time to a map of the distribution of frequencies by plotting amplitude versus frequency. The Fourier Transformations are performed in order to establish the intensity values and locations of specific pixels. These values may be stored, enhanced or otherwise processed and emerge to be displayed on a suitable screen, such as a cathode-ray tube 16, for example.

Figure 2:
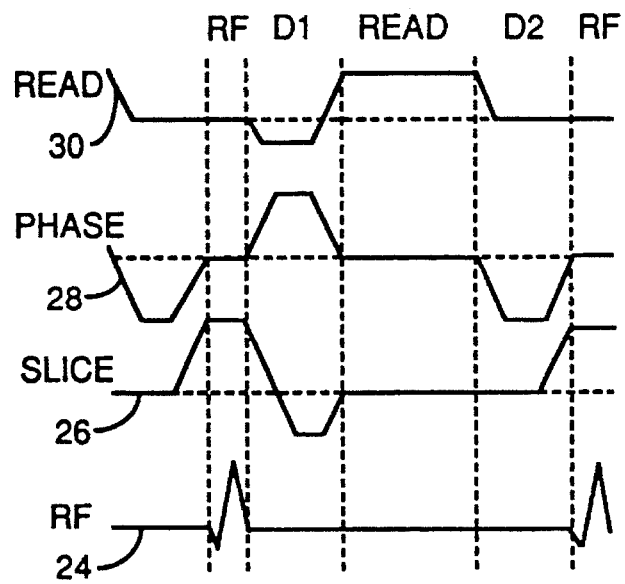
FIG. 2 is an illustration of a gradient-echo pulse sequence optimized for imaging non-oblique planes of the prior art.
Figure 3A:
FIGS. 3A, 3B, 3C, 3D are of the waveforms corresponding to FIG. 2 as applied to gradient amplifiers/coordinates.
Figure 3B:
Figure 3C:
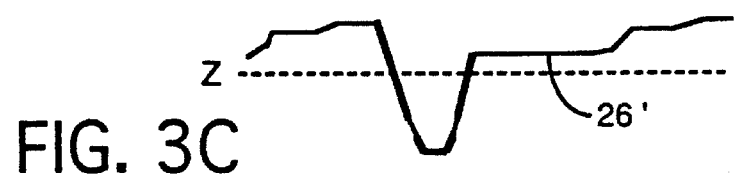
Figure 3D:
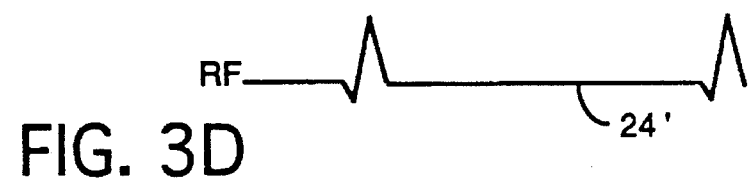
Figure 6A:
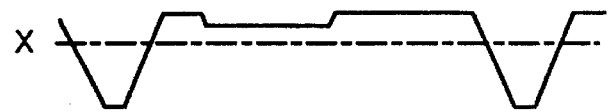
FIGS. 6A, 6B, 6C, 6D illustrate hardware optimized trapezoids for the gradient-echo pulse sequence showing amplifier currents
Figure 6B:
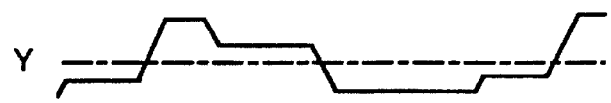
Figure 6C:
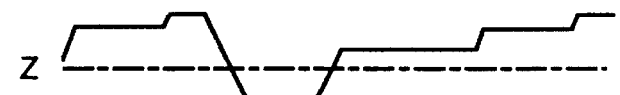
Figure 6D:
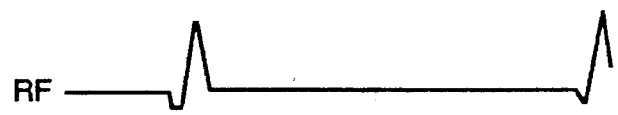
Figure 7A:
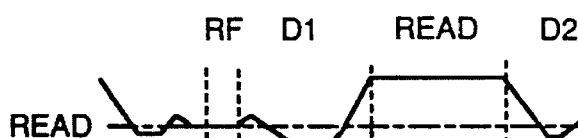
FIGS. 7A, 7B, 7C, 7D illustrate a corresponding gradient-echo pulse sequence which has been optimized.
Figure 7B:
Figure 7C:
Figure 7D:

Referring to the prior art representations of FIGS. 2 and 3, the gradient-echo pulse sequence includes the RF pulse sequence 24, the slice pulse 26, the phase encoding pulse sequence 28 and the readout pulse sequence 30. It will be appreciated by looking at the legends at the uppermost portion of FIG. 2 that the regions during which an RF pulse is being generated are labeled with the expression "RF" and the period for readout of data is indicated by the legend "READ." The intermediate dead-periods are labeled, respectively, D1 and D2. The present invention targets reduction in the D1 and D2 time periods which are the TE periods and the total elapsed time in the cycle of data acquisition which is the TR period. In this manner, the present invention permits the use of existing equipment at a particular facility with a customized designed waveform which facilitates reduction in the elapsed time periods D1, D2, in which the waveform shape is not important for image formation, but the zeroeth, first and higher moments of the waveform are. Such reduction of time is particularly critical in respect of oblique imaging and imaging of objects which are in motion such as cardiac imaging, for example.

Referring to FIG. 3, there are shown the RF pulses 24' and waveforms of FIG. 2 as converted to gradient amplifier coordinate systems for application to the gradient amplifier. For purposes of FIGS. 2 and 3, the imaging plane has been obtained by respective rotations of 30°, 30° and 45° rotations about the X, Y', Z" axis. An example of a suitable 30°, 30°, 45° rotation matrix is shown in Equation 2.

$$R = \begin{bmatrix} 0.612 & 0.612 & 0.500 \\ -0.789 & 0.436 & 0.422 \\ 0.047 & -0.660 & 0.750 \end{bmatrix} \quad (2)$$

FIG. 3 is illustrative of the problems created as the darkened regions of the respective gradient waveforms, as shown in pulse sequences 26', 28' and 30', are regions wherein the waveform exceeds the maximum allowable gradient level and slew rate. As a result, efforts to employ the pulses of FIG. 2 applied to the gradient amplifiers when used in imaging oblique planes, are inadequate because the waveform shown in FIG. 2 are no longer applied to the gradient amplifier. The application of the waveforms of FIG. 3 to the gradient amplifiers which will vary depending upon the orientation of the oblique slice, will produce undesired image artifacts and distortions. In this approach the waveforms that are applied to the amplifiers are actually the weighted sum of the slice, readout and phase encoding waveforms wherein the weights are a function of slice orientations. It is this type of problem with oblique imaging that the present invention is directed toward primarily, although, the solutions for oblique imaging are such that the present invention's techniques and associated apparatus may advantageously be employed in non-oblique imaging.

The present invention provides a system for calculating reduced and preferably the minimum duration dead-periods for scanning a given plane, including oblique planes. This is accomplished by focusing on the requirements of the gradient pulses for the particular scan plane during the dead-period based upon the starting gradient level, the ending gradient level and the moments contained within the waveform in the dead-period of the slice, phase encoding and readout directions. These values are transformed from the scan plane coordinates to amplifier coordinates with an appropriate rotation by an oblique rotation matrix. Within the amplifier coordinate system, the hardware optimized pulse for each gradient amplifier for a given starting amplitude, ending amplitude, and moments with a maximum slew rate waveform. This, in effect, is a waveform which has been optimized based upon the hardware considerations.

Referring in greater detail to FIGS. 4 and 5, the dead-period D1 has waveforms for slice direction 40, phase encoding direction 42 and readout direction 44. By determining the starting gradient level $s_s$, $s_p$, $s_r$, respectively, and the ending gradient levels $e_s$, $e_p$, $e_r$, as well as the zeroeth moment, i.e., area included within the waveform between the respective starting gradient levels and ending gradient levels, the minimum dead-periods based upon trapezoidal waveforms may be determined. In determining the zeroeth moment, the region under the waveform within the dead-period defined by Equation (1) with n=0. It is important to note that the present invention is useful as to all magnetic resonance imaging wherein the shape of the waveform within the dead-period is not of importance. This will include essentially all magnetic resonance imaging except spectroscopy not employing gradients. The invention uses of the three parameters, i.e., the starting gradient value, the ending gradient value and the moments, the waveform shape is not a required parameter. With respect to the moments, the zeroeth moment will be employed alone for some pulse sequences and with higher moments for other pulse sequences.

As the hardware limitations imposed upon the process and associated method are related to the slew rate and maximum current that an amplifier can achieve, in the preferred embodiment action is taken to convert the values shown in FIG. 4 to amplifier current coordinates from the imaging coordinates. The manner in which this transformation is achieved will now be considered.

The present invention employs a 3×3 orthogonal rotation matrix R that translates from the slice encoding waveform, the readout encoding waveform and the phase encoding waveform to the corresponding physical gradient amplifier coordinates. This transformation can be accomplished by multiplication of the parameter vectors with the rotation matrix, R, in accordance with Equation 3.

$$R \begin{bmatrix} s_r \\ s_p \\ s_s \end{bmatrix} = \begin{bmatrix} s_x \\ s_y \\ s_z \end{bmatrix}, R \begin{bmatrix} e_r \\ e_p \\ e_s \end{bmatrix} = \begin{bmatrix} e_x \\ e_y \\ e_z \end{bmatrix}, R \begin{bmatrix} a_r \\ a_p \\ a_s \end{bmatrix} = \begin{bmatrix} a_x \\ a_y \\ a_z \end{bmatrix}, \quad (3)$$

R is a matrix determined by the oblique angle being employed.

In Equation 3 lower case "s" and "e," respectively, represent the starting and ending gradient values and lower case "a" represents the zeroeth or higher moments. Subscripts "r," "p" and "s" represent, respectively, the readout, phase encoding and slice directions and lower case "x, y, z" represent the amplifier current directions. In this way, for each amplifier current direction, the parameters of starting and ending gradient values and moments can be determined.

The waveform of desired reduction or the shortest duration that satisfies the three parameters for the amplifier current directions to produce the reduced or shortest waveform satisfying these parameters is referred to as the "hardware optimized waveform." As used herein, the term shall be deemed to refer to trapezoidal waveforms, triangular waveforms with maximum slew rate ramps or other waveforms designed to utilize specific hardware optimally. The equation for the moment covered by the hardware optimized waveform with arbitrary starting and ending levels is a first or second order equation. The resultant amplifier coordinate waveforms are shown in FIG. 5 wherein for the "x,y,z" directions, respectively, $s_x$ and $e_x$ are the starting and ending gradient values and "$a_x$" is the zeroeth moment and for the "y" direction, the $s_y$ and $e_y$ beginning and ending gradient values with zeroeth moment $a_y$ and for the "z" direction, $s_z$ and $e_z$ with the zeroeth moment being $a_z$.

It is desired to keep the dead-period the same for each of the amplifiers and for each phase encoding step. The calculation time for the global minimum dead-period may be reduced by considering only the maximum and minimum phase encoding steps. As the required area for each amplifier is a linear function of the phase encoding step, either the maximum phase encoding step or the minimum phase coding step will give the longest of the minimum dead-periods. In this manner, by selecting the longest of the minimum dead-periods, which will become the global minimum, each amplifier will have the same dead-period and the amplifier's performance limits will not be exceeded. After determining the global minimum for each dead-period, a hardware optimized waveform pulse that satisfies the three parameters, i.e., the starting and ending current values and the moment and fits into this minimum time is designed.

While the preferred embodiment of the present invention involves seeking the minimum dead-periods, it will be appreciated that in some instances, one may obtain benefits of the invention by employing a reduced dead-period which may be greater than the absolute minimum. Such reduced dead-periods, when attained through the use of the methods or apparatus of the present invention, shall be deemed "minimum" for purposes of the invention. In such an approach, the targeted or desired degree of dead-period reduction will be the "minimum" in the practice of the invention.

In order to achieve extremely short TR and TE values, high duty cycle gradient amplifiers should be employed. In order to decrease power consumption wherever possible, the gradient level is decreased and the duration of the hardware optimized waveform is increased. As the waveforms that will be applied to the amplifiers are designed, the power required from the amplifiers can be evaluated by integrating the square of the waveform over time and TR can be increased if necessary. An example of a design is shown in FIG. 6 which illustrates the hardware optimized trapezoids for the gradient-echo pulse sequence. These waveforms represent the amplifier currents for the respective x, y, z axes and show the corresponding RF pulses. These were obtained through rotation of the oblique matrix by 30°, 30° and 45° rotations about the x, y' and z" axis under the influence of rotation matrix R. These waveforms can be applied directly to the gradient amplifiers. In the alternative, the hardware optimized trapezoid can be transformed back to the readout, phase encoding and slice coordinate system by multiplying the gradient waveform vector by the inverse of the oblique rotation matrix $R^{-1}$. This waveform, after transformation is shown in FIG. 7. It will be noted that the sequences have two dead-periods, D1 and D2. The waveform of FIG. 7 can be employed directly to apply the calculated waveform on the scanner. It is noted that although the waveforms applied to the amplifier, as shown in FIG. 6, are simple trapezoids, the slice, readout and phase encoding waveforms, as shown in FIG. 7, are somewhat complicated as optimizing in the scan plane coordinates is complex. In conventional designs, as shown in FIGS. 2 and 3, the reverse is true in that the slice, readout and phase encoding waveforms are simple and the waveforms that are applied to the gradient amplifiers are complex. To enhance understanding of this embodiment of the invention, an example will be considered. Employing hardware optimized waveforms in the form of trapezoidal pulses, TR values in the range of 7 milliseconds on oblique planes for the General Electric Signa Version 5.2 scanner that has isotropic gradients with a maximum gradient of 1 Gauss/cm and a slew rate of 0.167 T/sec/cm has been achieved. The minimum possible TR with this pulse sequence depends on the angle of the oblique plane and the specific imaging parameters, such as slice thickness, FOV (field of view), receiver bandwidth and number of phase encoding steps. A short axis image of the heart with a double oblique view was acquired using segmented k-space cardiac tagging as disclosed in McVeigh "0Cardiac Tagging with Breath Hold CINE MRI," Magn. Reson. Med., Vol. 28, pp. 318–327, (1992). This image was obtained employing the following parameters: 5 mm slice thickness; 250 Hz/pixel receiver band; 360 mm FOV; matrix size 256×128; partial echo and partial excitation, i.e., 1 sinc side lobe before and no side lobe after the main lobe of the sinc RF pulse.

Figure 8:
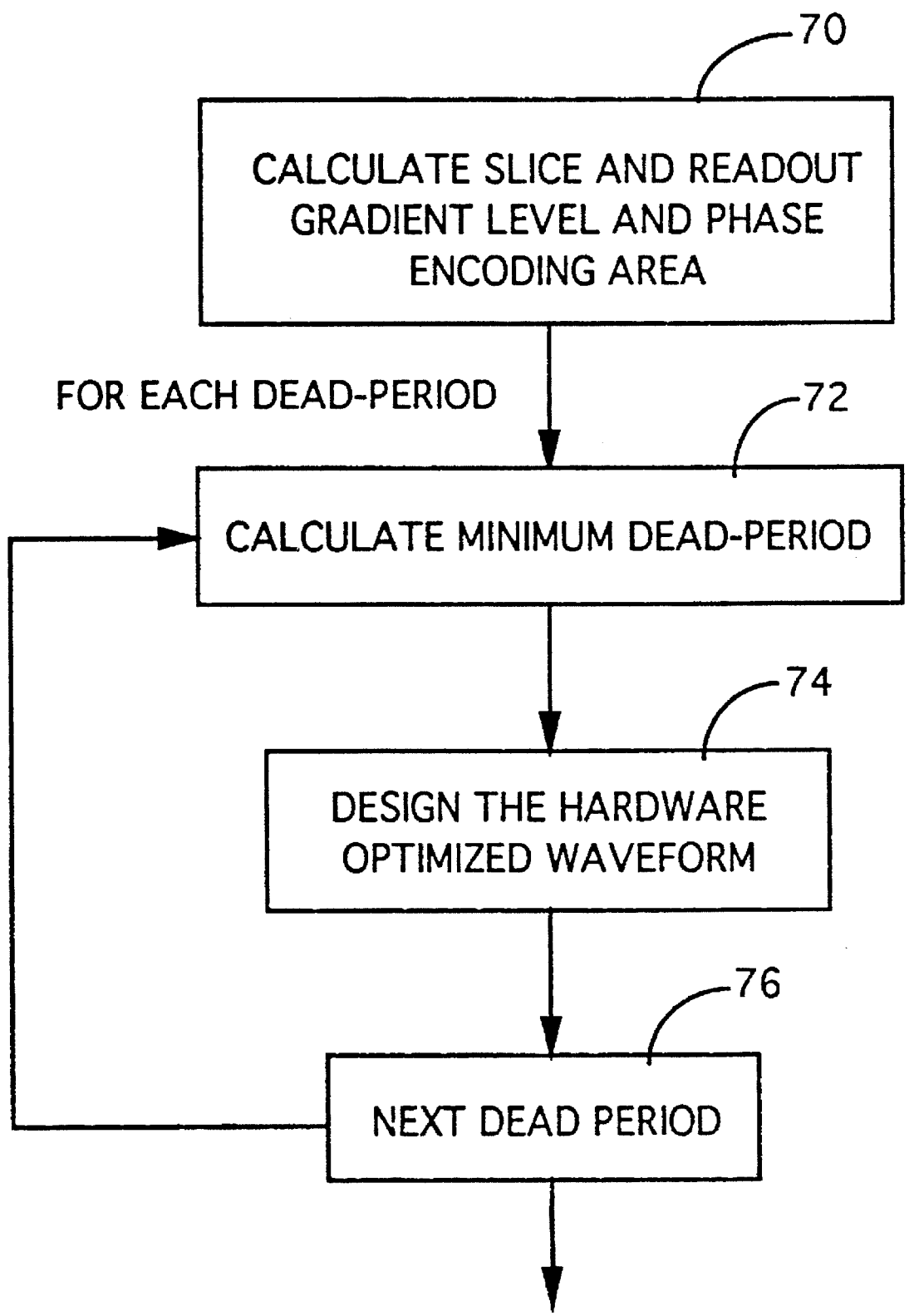
FIGS. 8 through 10 are logic diagrams showing a preferred practice of the present invention.

Referring to FIG. 8, the logic diagram shows a preferred practice of the present invention wherein the initial stage 70 involves calculating the slice and readout gradient levels along with the phase encoding area. For each dead-period, this information is processed by calculating the minimum dead-period 72 after which the longest of the minimum dead-periods is employed to design the hardware optimized waveform 74 which is applied to the gradient amplifiers. This process is employed for dead-period 76 as indicated by the arrow returning to block 72.

Figure 9:
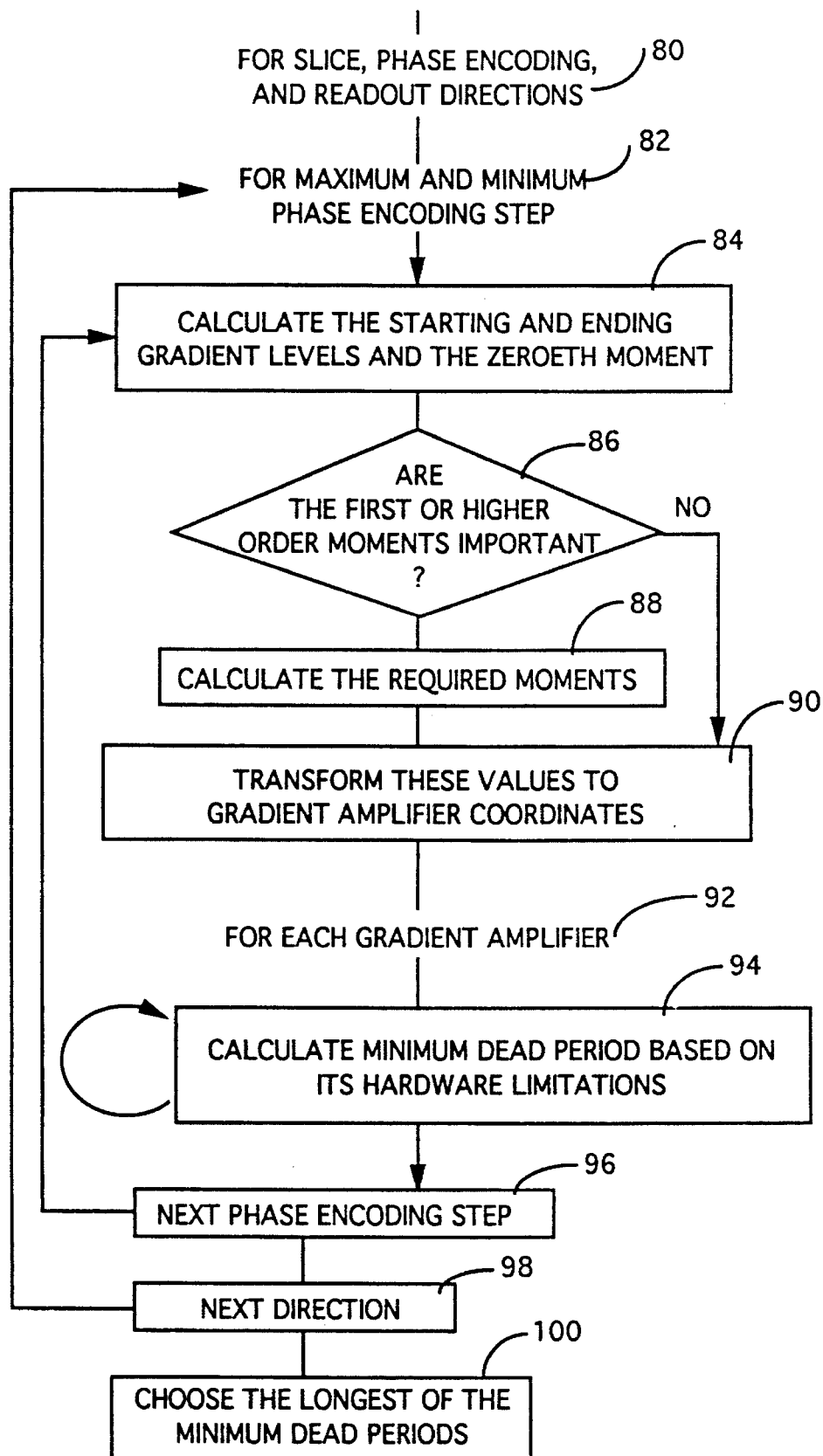

With reference to FIG. 9, greater details regarding the determination of minimum dead-period will be considered. For the slice, phase encoding and readout directions 80, the maximum and minimum phase encoding step 82 is determined by calculating the starting and ending gradient levels and the required area 84. Focusing on the maximum and minimum phase encoding step saves time. The next determination is whether the first or higher order moments are important 86. These would be important, for example, in the event the system were employed for velocity-encoded or flow-compensated computations. While these two examples employ the zeroeth and first order moments, other sequence uses will use the zeroeth moment (area) and/or second or higher moments, for example. The required moments are calculated 88 and the results 84, 88 directed toward the transformation of the values to gradient amplifier coordinates 90. If the moments are not important, the output of the response to 84 is delivered directly to the transformation to gradient amplifier coordinates portion 90. For each gradient amplifier 92, there is calculated the minimum dead-period based on its hardware limitation 94. The process is repeated for the next phase encoding step 96 and is further repeated for each direction 98 of gradient amplifier. The longest of the minimum dead-periods 100 is then determined. This will be employed in the design of the hardware optimized waveform as shown in FIG. 10.

Figure 10:
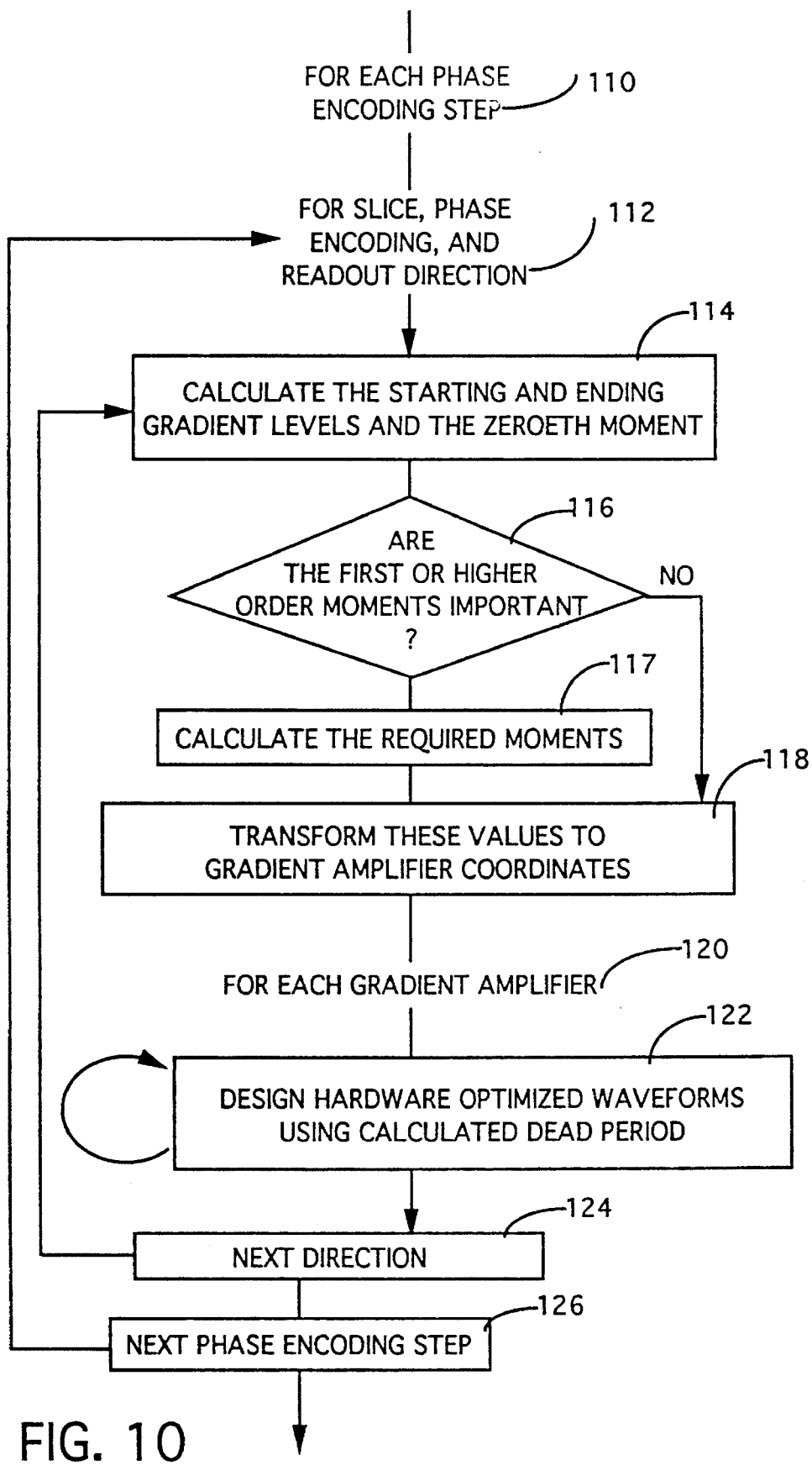

As shown in FIG. 10, for each phase encoding step 110, for the slice, phase encoding and readout direction 112, the starting and ending gradient levels, along with the required moments 114 are determined. If the first or higher order moments are important 113, the moments are calculated 117 and delivered along with the output of 116 to a transformation block 118. Such moments are important, for example, in respect of velocity-encoding or flow-compensation systems. If the moments are not of consequence, the output of 116 is delivered directly to 118, wherein the values are transformed to gradient amplifier coordinates through multiplication by the rotation matrix. For each gradient amplifier coordinate 120, the hardware optimized waveforms employing the calculated dead-periods design hardware optimized waveforms 122. For the next direction of gradient amplifier 124, the process is repeated. For each phase encoding step 126, the process is repeated.

Within the parameters of this example, the minimum TR and TE for the imaging parameters were determined. The minimum TR and TE values were calculated for all possible oblique orientations and phase and frequency encoding directions with a resolution of 5°. The results are summarized in Table 1 with the results being expressed in milliseconds.

TABLE 1

| | Hardware Optimized Waveform | | | | Scan Plane Opt. | | | |
|---|---|---|---|---|---|---|---|---|
| | Min | Max | Mean | Std. Dev. | Min | Max | Mean | Std. Dev. |
| TR | 6.516 | 6.964 | 6.769 | 0.112 | 6.964 | 8.554 | 7.945 | 0.463 |
| TE | 2.588 | 2.952 | 2.744 | 0.101 | 2.952 | 3.648 | 3.355 | 0.189 |

The TR and TE values were also calculated for the prior art scan plane optimization method which was described in the Bernstein et al. 1994 article cited hereinbefore. The hardware optimized waveform approach of the present invention in respect of minimum TR and TE established a reduction of up to 30 and 40 percent, respectively, in TR and TE as compared with the prior art scan plane optimization.

Figure 11:
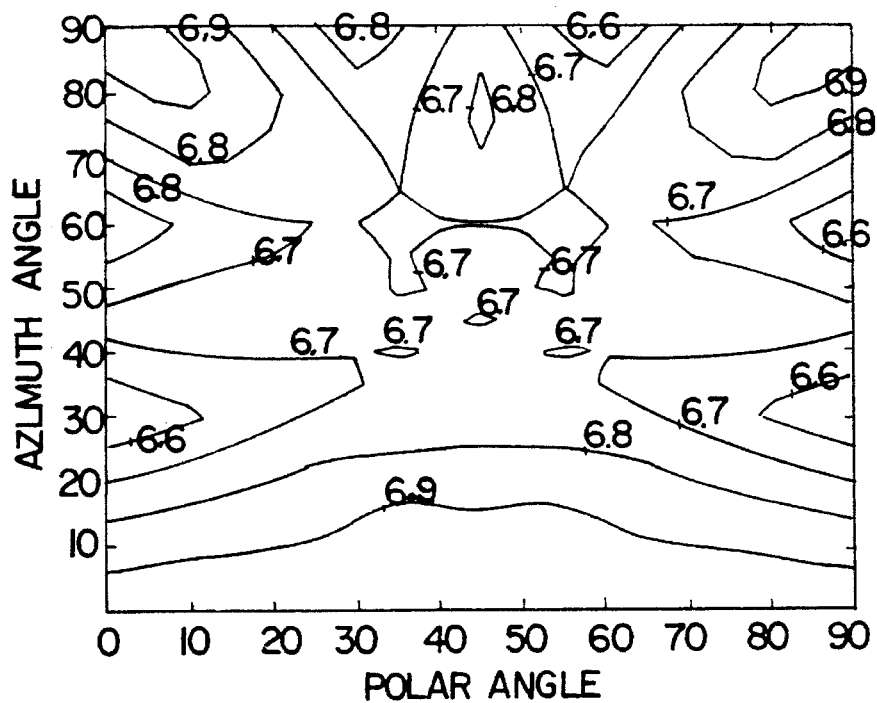
FIGS. 11 and 12 are contour plots of TR variation as a function of plane orientation for, respectively, the practice of the present invention and prior art scan plane optimization.
Figure 12:
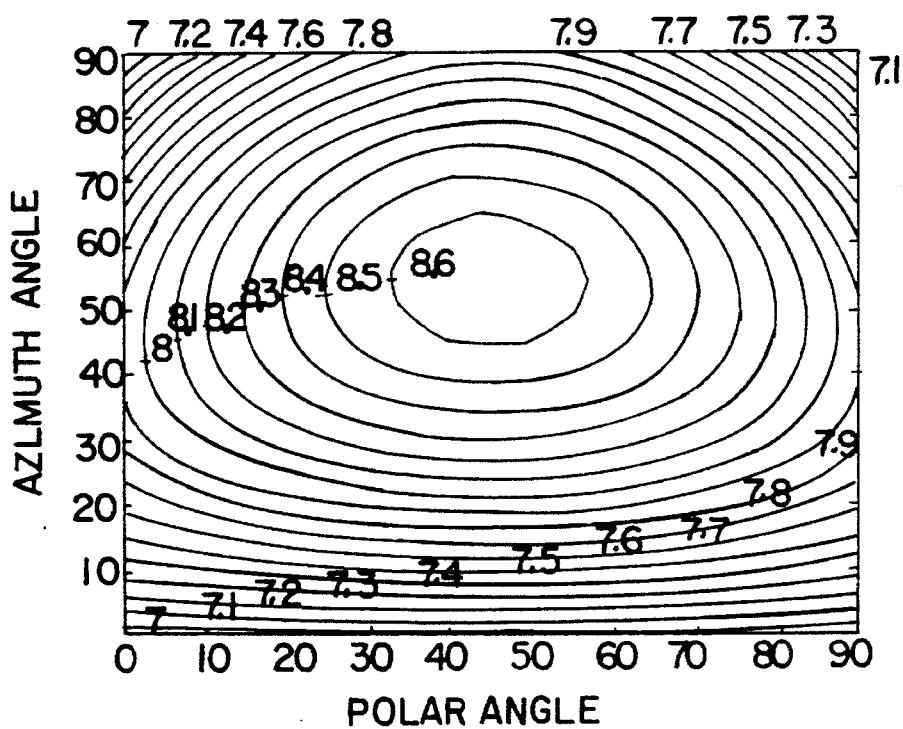

The TR and TE values as a function of slice orientation are shown in the contour plots of FIGS. 11 and 12. In these figures, the plane orientation is given by azimuth and polar angles of the plane normal. The frequency in phase directions of the RF pulse width that gave the minimum TR were employed. In comparing the hardware optimized waveforms, which in this embodiment were trapezoids of the present invention, of FIG. 11 with the prior art scan plane optimization as shown in FIG. 12, the TR variation for the former is less than for the latter. With hardware optimized trapezoid pulses of FIG. 11, the TR becomes smaller as the position of the slice becomes oblique. By contrast the scan plane optimization, as shown in FIG. 12, causes an increase in TR as the slice becomes oblique. This behavior also was observed for TE with the pulses. The highest TE value of the present invention was observed for non-oblique planes, whereas the scan plane optimization method of the prior art had the lowest TE at the non-oblique planes. For non-oblique imaging, hardware optimized trapezoidal pulses give the same minimum TR and TE as that obtained with scan plane optimization.

Figure 13:
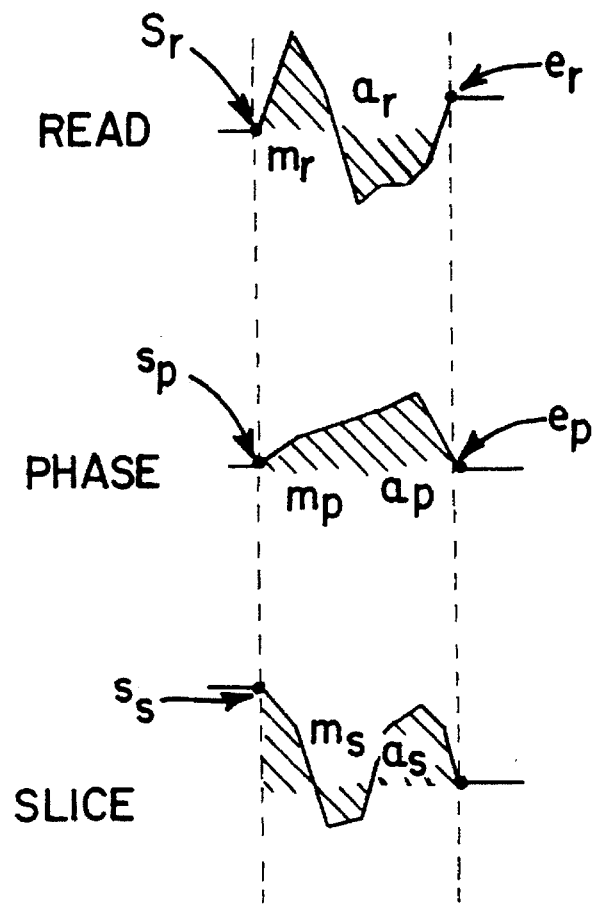
FIG. 13 is a plot of scan gradient coordinate values employing gradient moments and FIG. 14 is a plot of the waveforms of FIG. 13 after conversion to gradient amplifier coordinates.
Figure 14:
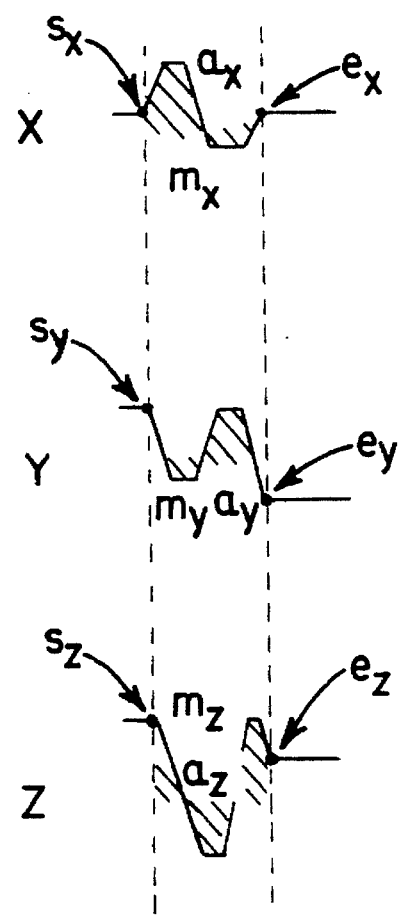

As disclosed hereinbefore, the moment parameter of the dead-period waveform may be the zeroeth moment (area), the zeroeth moment and higher moments depending upon the type of pulse sequences involved. For example, with flow-compensated and velocity-encoded gradient-echo pulse sequences and similar pulses, consideration is given to the first moments. The problem solved by the present invention is essentially the same as that previously discussed, wherein for some oblique slices being imaged, the waveforms applied to the gradient amplifiers may total on a single gradient amplifier in excess of the slew rate and maximum amplitude specifications for the amplifier, such as was shown in FIGS. 2 and 3. The hardware optimized waveform pulses employed to create amplifier current waveforms in accordance with the present invention, may be employed in connection with a wide variety of pulse sequences, such as for flow-compensated or velocity-encoded gradient-echo pulse sequences, for example. As shown in FIG. 13, in addition to considering as to each the readout, phase encoding and slice directions, the starting and ending gradient levels in addition to the areas $a_r$, $a_p$, $a_s$ (zeroeth moment), the first moments of the gradient waveforms, which have been designated, respectively, $m_r$, $m_p$, $m_s$ are considered. These parameters (starting and ending gradients, zeroeth moments and first moments) are then converted to gradient amplifier current coordinates, such as are shown in FIG. 14 by multiplying the parameter vectors by the appropriate rotation matrix. In addition to employing the converted zeroeth moments $a_x$, $a_y$, $a_z$, the first moments tax, my, $m_z$ are employed. The shape of the dead-period waveform is not important to this determination. The amplifier current coordinates are shown with the moments being respectively, $m_x$, $m_y$, and $m_z$. The next step is to calculate the minimum possible dead-period from the waveform that has the highest demand on one of the amplifiers. The solution for the minimum dead-period is simplified by the tact that the waveforms' use for this pulse will be maximum slew rate ramps or maximum amplitude constants. In a preferred approach, in determining the minimum dead-period, eight hardware optimized trapezoidal waveform types, such as that shown in FIG. 15, will be considered with one of them being selected for a given set of $s_x$, $s_y$, $s_z$, $e_x$, $e_y$, $e_z$, $a_x$, $a_y$, $a_z$, and $m_x$, $m_y$, $m_z$ parameters. Depending upon the waveform type, a second or fourth order polynomial equation will be solved to select the specific waveform in a manner known to those skilled in the art.

Figure 15:
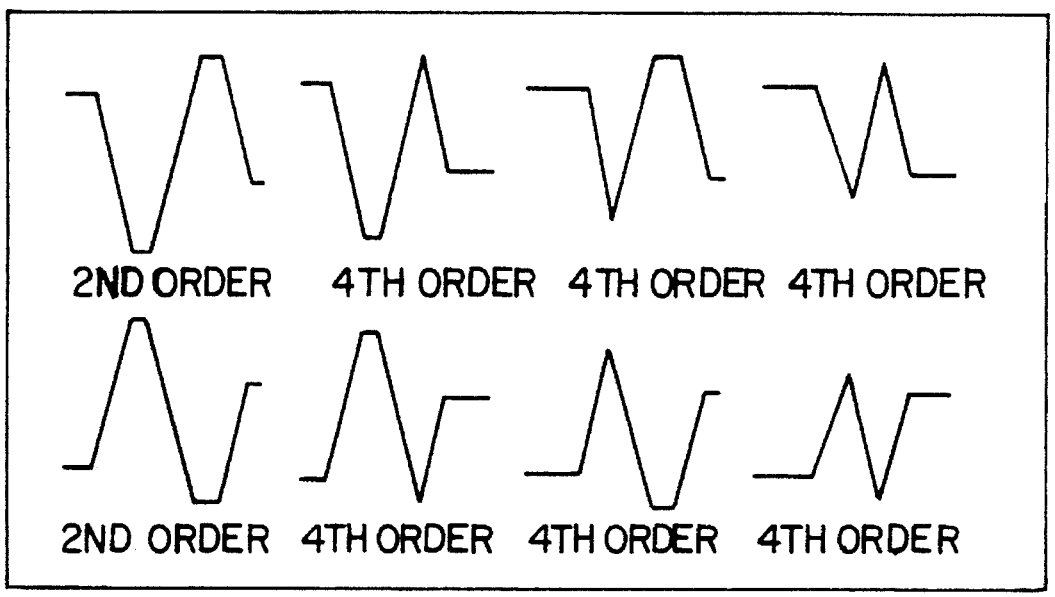
FIG. 15 is an array of eight types of hardware optimized trapezoidal pulses employable in the determination of the minimum dead-period.

Equal duration constant waveforms are added to each plateau in the bipolar pulses of the hardware optimized trapezoidal waveforms obtained in the determination of FIG. 15 to extend the pulse duration to the required period.

Figure 16:
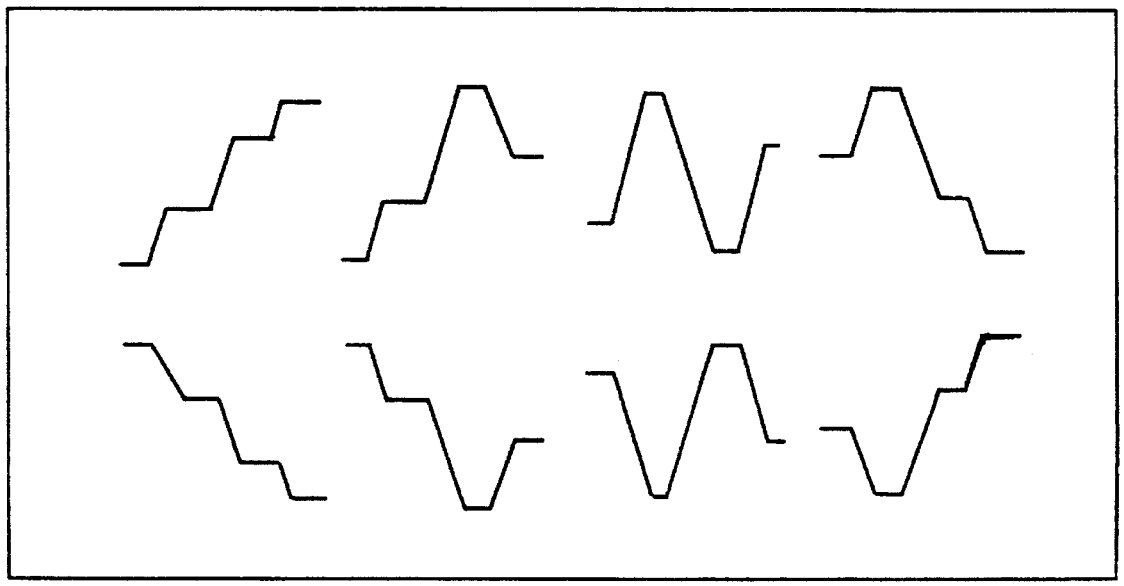
FIG. 16 is an array of waveforms of hardware optimized trapezoidal pulses employable in determining waveforms for the amplifiers to be played during the minimum dead-period.

In designing the waveforms to be employed during this minimum dead-period for this embodiment, the eight forms of hardware optimized trapezoidal waveforms shown in FIG. 16 will be considered with the waveform amplitudes and durations being calculated by solving a second order equation.

In this manner, in the example represented by FIGS. 13 through 16, the parameters of FIG. 14 and the waveform arrays of FIGS. 15 and 16 are employed in establishing the hardware optimized waveforms.

An example for a flow-compensated gradient-echo pulse sequence is shown in FIG. 17. This design is the hardware optimized design for an oblique plane that was obtained by 45° rotations about the x, y' and z" axes for a pulse sequence of the general type shown in FIG. 18. A rotation matrix suitable or 45°, 45°, 45° rotation is shown in Equation 4.

$$R = \begin{bmatrix} 0.500 & 0.500 & 0.707 \\ -0.854 & 0.146 & 0.500 \\ 0.146 & -0.854 & 0.500 \end{bmatrix} \quad (4)$$

If the pulse sequence of FIG. 18 were used for this specific oblique plane, the slew rate maximum amplitude limitations of the gradient amplifiers would be violated.

In order to confirm the operability of the invention in the context of the flow-compensated or velocity-encoded embodiments, an example will be considered. The minimum achievable TE for the imaging conditions used for cardiac imaging were considered with a slice thickness of 5 cm FOV (field of view) of 280 mm; partial echo, partial excitation; a pixel band with a 250 Hz/pixel; RF pulse duration of 2.5 msec. If the optimization were carried out for a non-oblique plane, the minimum TE would be 4.63 msec which, as shown in Table 2, equals the minimum value for oblique imaging by the prior art scan plane optimization method.

TABLE 2

| Hardware Optimized Trapezoidal | | | | Scan Plane Opt. | | | |
|---|---|---|---|---|---|---|---|
| Min | Max | Mean | Dev. | Min | Max | Mean | Dev. |
| 3.93 | 4.78 | 4.46 | 0.21 | 4.63 | 6.48 | 6.02 | 0.39 |

An alternate approach would be to calculate the maximum gradient level and slew rate reduction factor based on the scan plane. The statistics obtained employed using that method are shown in Table 2.

It will be appreciated, therefore, in respect of flow-compensation and velocity-encoding, the present invention offers a substantial reduction in TE by a non-iterative method which does not require user interaction. Both anisotropic and isotropic gradient sets can be utilized optimally.

While it will be well known to those skilled in the art how to determine the starting and ending gradient value and the moments for the waveform in the dead-period, a specific example of computation of the same will be considered with a gradient-echo pulse sequence. A "sinc" RF pulse with one left-side lobe and no right-side lobe is employed. Assuming the following parameters. Equations 5 through 7 will determine the slice gradient value, relationships 8 through 10 determine the readout direction gradient value, and Equation 11 through 13 determine the three values for phase encoding direction.

For slice gradient:

$$s_s = \frac{1}{\gamma thick\ t_{RF}/3} \quad (5)$$

$$e_s = 0 \quad (6)$$

$$m_s = -\frac{1}{\gamma thick} \quad (7)$$

For readout direction:

$$s_p = 0 \quad (8)$$

$$e_p = 0 \quad (9)$$

$$m_p = -\frac{i}{\gamma FOV_y} \quad (10)$$

For phase encoding direction:

$$s_r = 0 \quad (11)$$

$$e_r = \frac{1}{\gamma FOV_x t_s} \quad (12)$$

$$m_r = \frac{XRES_L}{\gamma FOV_x} \quad (13)$$

wherein:

$\tau$: Magnetogyric ratio thick: Slice thickness $t_{RF}$: Rf pulse duration i: phase encoding step $$-\frac{YRES-1}{2} \ ---\ -1/2, 1/2\ ---\ \frac{YRES-1}{2}$$

$FOX_x$: Field of view along the readout direction $FOV_y$: Field of view along the phase encoding direction $t_s$: Sampling rate of the MR signal YRES: Resolution along the Y direction XRES: Resolution along the X direction $XRES_L$: Number of samples of the MR signal before echo As the invention is adapted for use with conventional hardware, although if desired, it may be used employed with specialized hardware employable with magnetic resonance imaging, disclosure of the same need not be provided herein in detail. While reference to visual display means has been made herein so as to suggest "real-time" display, it will be appreciated that visual display can be accomplished by storing the image information and subsequently displaying the same on film and hard copies, for example. Such storage shall be deemed to be embraced with the reference to visual display means as an indirect means of getting information from the computer means to the visual display means.

The reduction in dead-period duration is reduced by the practices of this invention without reduction in signal to noise ratio.

It will be appreciate, therefore, that the present invention provides an improved method and associated apparatus for enhancing or maintaining image quality of magnetic resonance images while reducing the length of the data acquisition period. All of this is accomplished in a manner which focuses upon three specific variables within the dead-period and in general, is independent of the shape of the waveform within the dead-period. The invention employs the starting amplitude, the ending amplitude, and gradient moments of the dead-period to establish a reduced or minimum dead-period. The reduced or minimum dead-periods are transformed to gradient amplifier coordinates and are employed in combination with the starting and ending amplitudes and the gradient moments to create a hardware optimized waveform, which may be a trapezoidal waveform. The hardware optimized waveform for both oblique and non-oblique imaging is provided. The invention is also employable with velocity-encoded or flow-compensated pulse sequences, for example. All of this is accomplished in a manner which facilitates employing the gradient amplifiers that exist at a particular facility to maximum advantage.

Whereas particular embodiments of the present invention have been described above for purposes of illustration, it will be appreciated by those skilled in the art that numerous variations of the details may be made without departing from the invention as described in the appended claims.

We claim:

1. A method of minimizing the duration of dead-periods in magnetic resonance imaging pulse sequences comprising providing a specimen disposed within a main magnetic field, a source of pulsed RF signals, receiver means for receiving signals from said specimen responsive to said RF pulses and emitting responsive output signals, computer means for receiving said output signals from said receiver means and establishing image information related thereto and display means for displaying images from said imaging information, determining for said dead-periods for the scan plane gradient pulse for the slice, phase encoding and readout directions determining the starting and ending gradient values and moments of the dead-period waveform, transferring said values and moments to gradient amplifier coordinates, determining minimum dead-periods from said gradient amplifier values, and employing said minimum dead-periods to establish a hardware optimized waveform based upon said minimum dead-period values.

2. The method of claim 1 including employing said scan plane determination to determine the maximum and minimum phase encoding steps for said dead-period.

3. The method of claim 2 including determining the longest of said minimum dead-periods, and employing the longest said minimum dead-period to establish said optimized waveform.

4. The method of claim 3 including effecting transformation of said scan plane minimum dead-period values to gradient amplifier coordinates by multiplication by an oblique rotation matrix.

5. The method of claim 2 including establishing said waveform by for each phase encoding step determining the starting and ending gradient levels and the zeroeth moments contained within the dead-period waveform, transforming said values into gradient amplifier coordinates, and employing said transformed gradient amplifier coordinates in determining said hardware optimized waveform.

6. The method of claim 5 including employing said method to image an oblique plane.

7. The method of claim 6 including effecting said minimum dead-period determination without regard to the shape of said dead-period waveform.

8. The method of claim 5 including effecting said hardware optimized waveform determination without regard to the shape of said dead-period waveform.

9. The method of claim 5 including employing each said hardware optimized waveform respectively on said gradient generating amplifiers.

10. The method of claim 5 including employing said method while remaining within the amplifier gradient level and slew rate limitations of said gradient amplifiers.

11. The method of claim 5 including employing said method in breath-hold cardiac imaging.

12. The method of claim 5 including employing in minimum dead-period determination in addition to said scan plane gradient pulse, starting and ending gradient values and said zeroeth moment for said slice, phase encoding and readout directions, at least one higher moment of the dead-period gradient waveforms.

13. The method of claim 12 including employing a trapezoidal waveform as said hardware optimized waveform.

14. The method of claim 13 including in employing said minimum dead-periods to establish a trapezoidal waveform employing for each phase encoding step for slice, phase encoding and readout directions starting and ending gradient values, and the zeroeth and first moments of the dead-period gradient waveforms.

15. The method of claim 14 including employing said method in processing at least one pulse sequence selected from the group consisting of velocity-encoded pulse sequences and flow-compensated pulse sequences.

16. The method of claim 12 including in determining said dead-period after transformation of said scan plane coordinates to gradient amplifier coordinates employing hardware limitations in determining said minimum dead-period.

17. The method of claim 6 including alter determining said hardware optimized waveform transforming said hardware optimized waveform to scan plane coordinates.

18. The method of claim 17 including employing a trapezoidal waveform as said hardware optimized waveform.

19. The method of claim 18 including employing the inverse of a rotation matrix in effecting said conversion to scan plane coordinates.

20. The method of claim 6 including employing said method on a plurality of dead-periods within a gradient-echo pulse sequence.

21. Apparatus for minimizing dead-periods in magnetic resonance imaging pulse sequences comprising magnetic field generator means for establishing a main magnetic field on a specimen, magnetic field gradient generating means for establishing gradients in said magnetic field, RF signal generating means for emitting pulsed RF signals to at least a portion of said magnetic field passing through said specimen, dead-period determining means for determining phase encoding steps by determining for the slice, phase encoding and readout directions, the pulse starting and ending gradient values and the moments contained within the dead-period waveform, means for transforming these scan plane dead-period values and moments to gradient amplifier coordinates, design waveform creating means for employing a dead-period determined by said dead-period determining means and establishing a hardware optimized waveform based thereon, receiver means for receiving signals emitted from said specimen responsive to said RF pulses and emitting responsive output signals, computer means for receiving said output signals from said receiver means and establishing image information related thereto, and visual display means for displaying images from said image information received from said computer means.

22. The apparatus of claim 21 including said dead-period determining means having means for determining the minimum and maximum said phase encoding steps.

23. The apparatus of claim 22 including said dead-period determining means having means for determining the longest said minimum dead-periods, and said design waveform creating means employing said longest minimum dead-period as said dead-period.

24. The apparatus of claim 23 including said means for transforming including multiplication by a rotating matrix.

25. The apparatus of claim 21 including said dead-period determining means having means for effecting said dead-period determination in oblique plane magnetic resonance imaging.

26. The apparatus of claim 24 including said rotating matrix being an oblique plane rotating matrix.

27. The apparatus of claim 22 including said design waveform creating means having means for establishing said design waveform for each phase encoding step for the slice, phase encoding and readout direction by determining the starting and ending gradient values and the moments contained within said dead-period waveform and transforming said dead-period values and moments into gradient amplifier coordinates and creating said hardware optimized waveform therefrom.

28. The apparatus of claim 21 including said dead-period determining means and said design waveform creating means having means for effecting said determinations with respect to an oblique plane of said specimen.

29. The apparatus of claim 28 including said dead-period determining means effecting said determination without regard to the shape of said dead-period waveform.

30. The apparatus of claim 29 including said design waveform creating means effecting said hardware optimized waveform determination without regard to the shape of said dead-period waveform.

31. The apparatus of claim 30 including said apparatus having means for employing each said hardware optimized waveform respectively on each said gradient generating amplifiers.

32. The apparatus of claim 30 including said design waveform creating means creating said trapezoidal waveform which will remain within the gradient levels and slew rates of said amplifiers.

33. The apparatus of claim 21 including said dead-period determining means having means for determining said phase encoding steps by determining a higher moment of said dead-period waveform for said slice, phase encoding and readout directions in addition to determining said starting and ending gradient values and the zeroeth moment.

34. The apparatus of claim 27 including said design waveform means employing in establishing said hardware optimized waveform for each phase encoding step the starting and ending gradient values and moments for the slice, phase encoding and readout directions.

35. The apparatus of claim 18 including said apparatus being employable in breath-hold magnetic resonance cardiac imaging.

36. The apparatus of claim 33 including said apparatus being employable with respect to at least one pulse sequence selected from the group consisting of velocity-encoded pulse sequences and flow-compensated pulse sequences.

37. The apparatus of claim 33 including said higher moment being a first moment.

38. The apparatus of claim 28 including said design waveform creating means having means for effecting said hardware optimized waveform as a trapezoidal waveform.

39. The apparatus of claim 28 including said design waveform means having means for transforming said hardware optimized waveform to scan plane coordinates.

40. The apparatus of claim 39 including said design waveform means employing the inverse of a rotation matrix in effecting said conversion to scan plane coordinates.

* * * * *

UNITED STATES PATENT AND TRADEMARK OFFICE
CERTIFICATE OF CORRECTION

PATENT NO. : 5,512,825
DATED : April 30, 1996
INVENTOR(S) : Ergin Atalar and Elliot R. McVeigh It is certified that error appears in the above-identified patent and that said Letters Patent is hereby corrected as shown below:

Column 6, line 28, "$S_t$," should be -- $S_r$ --.

Column 8, line 30, "0" should be deleted.

Column 10, line 31, "tax" should be -- $m_x$ --.

Column 10, line 32, "my" should be -- $m_y$ --.

Column 10, line 38, "tact" should be -- fact --.

Signed and Sealed this

Sixteenth Day of December, 1997

*Attest:*

BRUCE LEHMAN

*Attesting Officer*  Commissioner of Patents and Trademarks